United States Patent
Ebner

(10) Patent No.: US 7,579,891 B2
(45) Date of Patent: Aug. 25, 2009

(54) METHOD AND CIRCUIT ARRANGEMENT FOR GENERATING A PERIODIC ELECTRIC SIGNAL WITH CONTROLLABLE PHASE

(75) Inventor: Christian Ebner, Munich (DE)

(73) Assignee: National Semiconductor Germany AG, Unterhaching (DE)

( * ) Notice: Subject to any disclaimer, the term of this patent is extended or adjusted under 35 U.S.C. 154(b) by 19 days.

(21) Appl. No.: 11/745,790

(22) Filed: May 8, 2007

(65) Prior Publication Data
US 2007/0268060 A1  Nov. 22, 2007

(30) Foreign Application Priority Data
May 19, 2006  (DE)  ........................ 10 2006 023 695

(51) Int. Cl.
*H03H 11/16* (2006.01)
(52) U.S. Cl. ..................................... 327/237
(58) Field of Classification Search .................. 327/231, 327/237, 359
See application file for complete search history.

(56) References Cited

U.S. PATENT DOCUMENTS

| | | | |
|---|---|---|---|
| 6,943,606 B2 * | 9/2005 | Dunning et al. | 327/231 |
| 7,180,352 B2 * | 2/2007 | Mooney et al. | 327/237 |
| 7,298,195 B2 * | 11/2007 | Freyman et al. | 327/247 |
| 2003/0002607 A1 | 1/2003 | Mooney et al. | |

FOREIGN PATENT DOCUMENTS

EP  0 909 035 A2  4/1999

OTHER PUBLICATIONS

Yueming Jiang and Alessandro Piovaccari, "A compact phase interpolator for 3.125G Serdes Application", SSMSD 2003, IEEE, pp. 249-252, 2003.

* cited by examiner

*Primary Examiner*—Jeffrey S Zweizig
(74) *Attorney, Agent, or Firm*—Pearne & Gordon LLP

(57) ABSTRACT

The invention relates to the generation of an electric output signal with a specified frequency and a phase (P) dependent upon a control signal (x) by means of weighted superposition of several input signals (s1, s2, s1*, s2*), which have the specified frequency but different input signals phases, whereby the weighted superposition is applied to a parallel switching of adjustable transconductance stages which are each adjusted by the control signal (x) and to each of which one of the input signals (s1, s2, s1*, s2*) is supplied. In order to be able to use this so-called phase interpolation to meet higher linearity requirements, the invention provides that for the generation of the output signal with a phase which lies between a first input signal phase (0°) of a first input signal (s1) and a second input signal phase (120°) of a second input signal (s2) which second phase is larger by a phase difference (120°), the first input signal (s1) and the second input signal (s2) and two further input signals (s1*$_1$, s2*$_1$ and S1*$_2$, s2*$_2$ resp.) are superimposed in a weighted fashion, whereby the two further input signals (s1*$_1$, s2*$_1$ and S1*$_2$, s2*$_2$ resp.) have phases different by the phase difference (120°) and are phase-shifted by one half (60°) of the phase difference with regard to the first and second input signals (s1, s2).

8 Claims, 3 Drawing Sheets

METHOD AND CIRCUIT ARRANGEMENT FOR GENERATING A PERIODIC ELECTRIC SIGNAL WITH CONTROLLABLE PHASE

BACKGROUND OF THE INVENTION

1. Field of the Invention

The present invention relates to a method for generating a periodic electric signal with a phase dependent upon a control signal by means of a weighted superposition of several input signals, which have a specified frequency but different input signals phases, whereby the weighted superposition is applied to a parallel arrangement of adjustable transconductance stages which are each adjusted by the control signal and to each of which one of the input signals is supplied.

Further, the invention relates to a circuit arrangement for carrying out such method.

Such signal generation may, for example, be employed in the so-called recovery of clock signals.

2. Description of the Prior Art

Such a method and such a circuit arrangement are known, for instance, from the article by Yueming Jiang and Alessandro Piovaccari, "A compact phase interpolator for 3.125G Serdes Application", SSMSD 2003, IEEE, pages 249 to 252, 2003.

With the known method, as shown in FIG. 3 of this publication, 12 input signals are initially generated with a fixedly predetermined frequency, but with input phases distributed equidistantly over the 360° range. Then two input signals adjacent to one another with regard to their phase are selected and subjected to a "fine interpolation" in order to generate the desired output signal with the specified frequency and a phase which lies between the input phases of the two selected input signals.

The switching arrangement used for this phase interpolation is illustrated in FIG. 5 of the publication and comprises a parallel arrangement of adjustable transconductance stages (transistor pairs) for generating the output signal through a weighted superposition of the two selected input signals, whereby an adjusting current outputted by a digital/analog converter is applied to each of the transconductance stages, and whereby further one of the two input signals is directed to the transconductance stages (as transconductance input voltage). With this arrangement the digital/analog converter supplies, as it were, the weighting factors for the weighted superposition of the two input signals, which is performed by the transconductance stages. The currents supplied by the transconductance stages are brought together (superimposed) and jointly guided across a resistance load, so that eventually, the desired output signal is provided at the resistance load as a voltage drop. A control signal supplied to the digital/analog converter in a thermometer coding with 8 bits causes the total bias current of the two transconductance stages to be divided at ratios of 8:0, 7:1, 6:2, 5:3, 4:4, 3:5, 2:6, 1:7 or 0:8 (depending upon the state of the control signal).

This known phase interpolation has a number of disadvantages.

A first disadvantage is that the correlation between the phase of the output signal and the settings of the transconductance bias currents (adjusting currents) is not linear. The non-linearity increases, the more the phase difference increases between the two input signals used in the interpolation. This can be illustrated using as an example a circle which has straight lines drawn through the centre of the circle and through subdividing points located equidistantly at a secant of the circle, which intersect the arc of the circle at points which, as regards the angle, are only approximately equidistant (this problem will be explained again below with reference to FIG. 2).

The linearity of the phase interpolation can be improved in a simple way by providing a larger number of input signals of the plurality of input signals. But in practice this is only possible up to a point due to the amount of complexity of the circuit arrangement needed.

A further major problem often experienced in practice results from the fact that transductance stages arranged in parallel influence each other to a greater or lesser extent leading to a considerable falsification of the output phase. A particular problem is that the extent of this falsification is dependent upon the "weighting ratio" of the two input signals involved. In particular this extent is different for "extreme weightings" (such as 8:0 and 0:8) compared to "medium weightings" (such as 4:4). With the circuit topology of the above mentioned publication illustrated in FIG. 5 of the same, parasitic capacities between the gate and drain terminals of the transconductance transistors are a contributor to this disadvantageous effect. The drain potential is influenced more or less by the gate potential via this capacitive coupling, whereby the extent of the influence depends upon the phase difference between gate potential and drain potential.

SUMMARY OF THE INVENTION

It is an object of this invention to specify a way for generating an electric output signal of the kind mentioned above, by means of which higher linearity requirements can be met.

This object is substantially solved by a method characterised in that when generating the output signal with a phase, which lies between a first input signal phase of a first input signal and a second input signal phase of a second input signal, which second phase is larger by a phase difference, the first input signal and the second input signal and additionally two further input signals are superimposed in a weighted fashion, whereby the two further input signals have phases different by the phase difference and are phase-shifted by one half of the phase difference with regard to the first and second input signals.

Further, the above objet is met by a circuit arrangement characteristed in that, when generating the output signal with a phase which lies between a first input signal phase of a first input signal and a second input signal phase of a second input signal which second phase is larger by a phase difference, the first input signal and the second input signal and two further input signals are superimposed in a weighted fashion, whereby the two further input signals have phases different by the phase difference and are phase-shifted by one half of the phase difference as regards the first and second input signals.

Advantageous further developments of the invention which can be used as such or in combinations are described below.

With the invention two phase interpolators are arranged in parallel, as it were, whereby the phase position of the input signals of one of the interpolators lies halfway between the phases of the input signals of the other interpolator, which has the effect that the non-linearities of the two interpolators, at least partially, compensate each other. For when an "extreme weighting" is performed during interpolation between the first input signal and the second input signal, the result for the interpolation between the two further input signals is a "medium weighting" and vice versa.

In essence the invention thus permits generation of an electric output signal, for which in particular, even for a comparatively large phase difference between the first and the second input signals, an output phase of the output signal can be achieved, which has a high linearity.

BRIEF DESCRIPTION OF THE DRAWINGS

The invention will now be described in more detail by way of example embodiments with reference to the accompanying drawings, in which.

DESCRIPTION OF THE PREFERRED EMBODIMENT(S)

Figure 1:
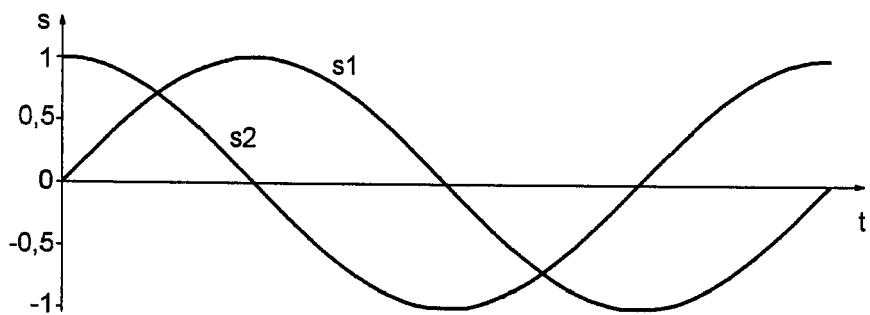
FIG. 1 shows a time progression diagram for two input signals with an identical frequency, but a different phase.

FIG. 1 shows the progression, over the time t, of two signals s1, s2, as an example, both being sinoidal in shape. The signal value s of the two signals s1, s2 fluctuates between the values −1 and +1.

FIG. 2 again shows the two signals s1, s2 having the same frequency in a pointer diagram normally used for such signal progressions. In this diagram each of the signals s1, s2 is symbolised by a pointer in a standard circle. While time progresses both these pointers rotate clockwise. The phase difference between the signals s1, s2 in this diagram corresponds to the angle between the two pointers (here 90°).

Figure 3:
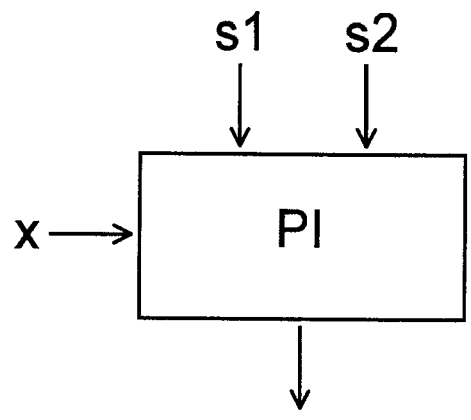
FIG. 3 shows a block diagram of a phase interpolator for generating an output signal by means of an interpolation between the two input signals, whereby the phase of the output signal is specified by a control signal.

FIG. 3 represents the generation of a signal s12(x) which shall have the same frequency as the signals s1, s2 also referred to as input signals in the following, but shall have a phase specified by a control signal x, which phase lies between the two phases of the input signals s1, s2.

Figure 2:
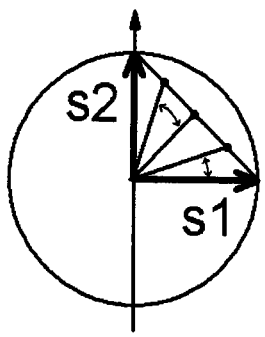
FIG. 2 shows a pointer diagram for the two input signals of FIG. 1.

Such a "phase interpolation" based on a weighted addition of input signals s1, s2 is depicted in the pointer diagram of FIG. 2. It is clear that each of the input signals s1, s2 can be obtained at the output of the phase interpolator, if the respective signal already existing as an input signal is included with a weight of 100% during the weighted addition. For other weightings (or states of the control signal x) output signals s12(x) are obtained, of which the pointers in the pointer diagram of FIG. 2 are lying on a secant between the pointer ends of the input signals s1, s2. In FIG. 2, for instance, 3 such output signals are symbolised by corresponding dots on a secant which are the result for weighting ratios of 3:1, 2:2 and 1:3. From this representation it can also be seen that the correlation between "weighting steps equidistant on the secant" and the resulting phase steps of the output signal is not linear. The angle steps are not of equal size.

Figure 4:
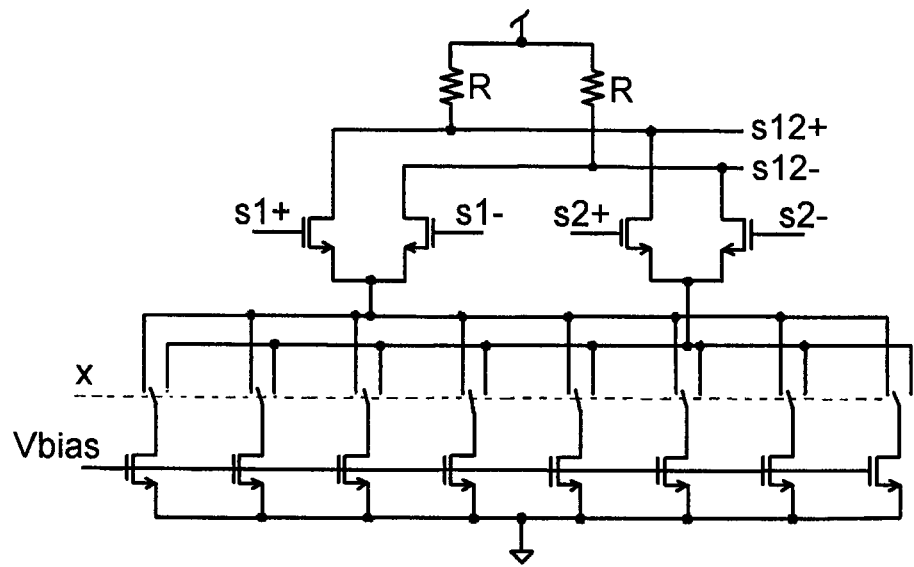
FIG. 4 is a circuit-technical realisation of a phase interpolator known in the art.
Figure 5:
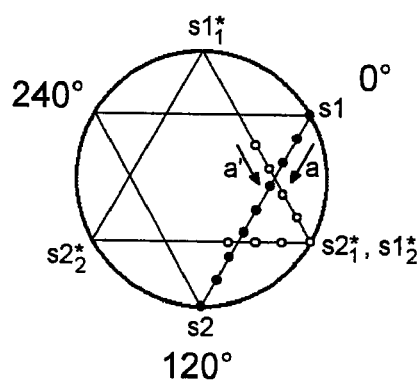
FIG. 5 shows a pointer diagram for illustrating the invention according to a first embodiment.

FIG. 4 shows a circuit-technical realisation of a phase interpolator known from the initially mentioned article by Yueming Jiang and Alessandro Piovaccari (see also FIG. 5 there).

Although the mode of operation of this circuit arrangement comprising a digital/analog converter, two transductance stages arranged in parallel and a resistance load R driven by these transductance stages has already been described above, we would like to add the following at this stage: the 8 field effect transistors depicted in the lower part of FIG. 4 are of identical design and form constant current sources whose ratings (currents) are fixedly specified by a adjusting potential Vbias which is applied to all control connections (here gate terminals) of these current source transistors. The control signal x is a thermometer-coded digital signal with 8 bits for driving the 8 toggle switches which respectively direct the current supplied from a current source as adjusting current to either the left-hand or right-hand (in the figure) transductance stage (transistor pair). The elements drawn as toggle switches should be realised as transistor arrangements in practice. Furthermore one of the two signals s1, s2 is respectively supplied as actual input signal to the transductance stages. These signals s1, s2 are provided here as differential signals. In the illustrated realisation of the transductance stages in the form of a pair of field effect transistors combined here to form one channel terminal each, two signal potentials s1+, s1− (for signal s1) and two signals s2+, s2− (for signal s2) are applied at the gate terminals. The drain terminals of the transistors acted upon by the signal potentials s1+, s2+ are interconnected and form a first output terminal for providing a first output potential s12+. The drain terminals of the transistors acted upon by the signal potentials s1−, s2− are interconnected and form a second output terminal for providing a second output signal s12−. The output signal s12(x) which depends upon the state of the control signal x is also a differential one and corresponds to the difference of the potentials s12+ and s12−.

In contrast to the interpolation example illustrated in FIG. 2 the phase interpolator of FIG. 4 can be used to drive a total of 9 interpolation states (output phases). This allows extreme weightings to be carried out, in which almost all or all of the individual currents supplied by the current sources can be switched to one of the two transductance stages, or medium weightings to be carried out, in which the currents are distributed more evenly across both transductance stages.

As already explained at the beginning this circuit arrangement results in difficult-to-handle non-linearities of the phase dependency, which in particular is due to the fact that the ratio of transductance to effective parasitic capacity varies along with the weighting factors set by the control signal x. This problem is also revealed in more detail in FIGS. 5 and 6 described below which are now also used to explain the way in which this problem can be eliminated according to the invention.

FIG. 5 is a pointer diagram corresponding to FIG. 2, in which only the end points of the pointers are indicated for simplicity's sake.

In contrast to the example shown in FIG. 2, two input signals s1, s2 here have a phase difference of 120°. In this case generation of the desired output signal starts by a plurality of input signals totalling 6 input signals being provided, the phases of which are at 0°, 60°, 120°, 180°, 240° and 300°. In the following, for simplicity's sake, only the generation of one output signal sout(x) depending upon a control signal x with a phase in the range of 0° to 120° is explained. Output signals having different phases are generated in a similar manner following the selection of other input signals as a basis for the interpolation described below. In this respect the angle association shown in FIG. 5 of s1 (at 0°) and s2 (at 120°) corresponds to a "rough interpolation" which precedes the proper interpolation. In the illustrated example this means, for example, that to generate an output phase in the range of 120° to 240° the signals s1 und s2 would be at 120° and 240°.

The interpolation method known in the art is illustrated in FIG. 5 by the filled-in dots with a total of 9 interpolation states on the secant between s1 and s2.

Figure 6:
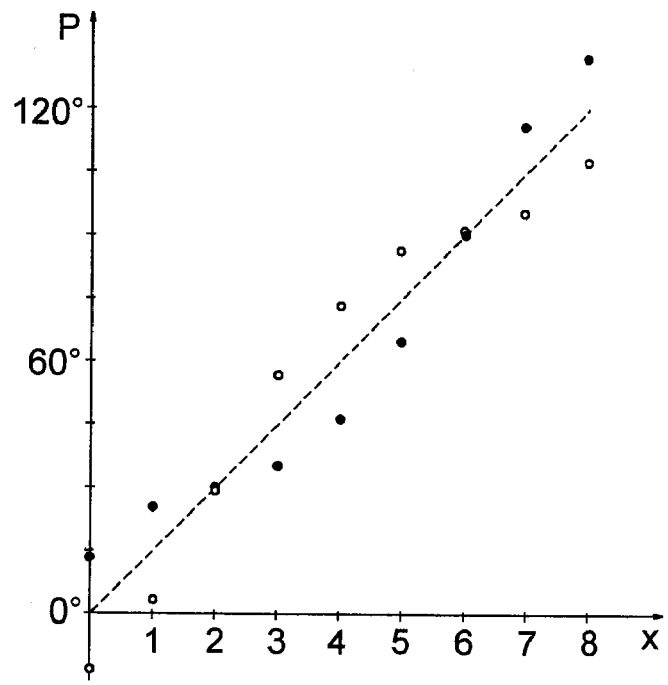
FIG. 6 is a representation illustrating the correlation between the phase of an output signal and a control signal for the first embodiment.

FIG. 6 shows the case illustrated in FIG. 5 of an interpolation between the input signals s1, s2 by way of plotting the output phase P as a function of the control signal x. If the interpolation of a circuit arrangement according to FIG. 4 is carried out, the value of the control signal x corresponds to the number of current sources the current of which is directed to the transconductance stage which in FIG. 4 is on the right-hand side.

If in the illustrated example the value x is changed successively from 0 to 8, this would correspond, in the pointer diagram of FIG. 5, to a passing through the filled-in dots from s1 in the direction of an arrow a as far as s2.

The filled-in dots in FIG. 6 illustrate that the output phase thus generated has a systematic deviation from an "ideal phase" drawn as a broken line. With this arrangement the concrete value of the phase is dependent upon the type of transconductance stages used and is drawn here as an example. However, as explained above, the extent of deviation for extreme control signals such as 0 or 8 is always quite different compared to that for medium control signals such as 4.

The solution according to the invention for linearising the phase characteristic is that in addition to superimposing the input signals s1, s2 upon each other in a weighted fashion, two further input signals are included with interpolation taking place simultaneously between these two further input signals and in that the result of the interpolation is added to the result of the first interpolation. In other words, two pairs of input signals are included in the interpolation according to the invention. In the example of FIG. 5 the two additional input signals for control signal values x in the range from 0 to 4 are the signals $s1^*_1$ and $s2^*_1$, whereas for control signal values x in a range of 4 to 8, the additional input signals $s1^*_2$ and $s2^*_2$ are used. These are input signals from the plurality of input signals provided. They are situated at the phases 300°, 60° and 180°.

In order to carry out further interpolation between the additional input signals $s1^*_1$ and $s2^*_1$ and the additional input signals $s1^*_2$ and $s2^*_2$, a total of 9 interpolation states are provided respectively, which can also be provided using a circuit arrangement as shown in FIG. 4. The states used for the further interpolation are represented by hollow dots in FIG. 5, which when the control value x is changed from 0 to 8, are passed through in the direction of arrow a'.

With the control signal value x=4 it does not matter whether the additional pair of input signals is $s1^*_1$ and $s2^*_1$ or $s1^*_2$ and $s2^*_2$, since in both cases the corresponding value for the 60° phase could be achieved by further interpolation (in this situation only the further 60° input signal has a weight, whereas the 300° or 180° input signals have none).

FIG. 6 shows the hollow dots again representing the interpolation results of the further interpolation. It can be seen (due to the phase position of the additional input signals in relation to the former input signals) that the extent of deviation of phase P from the ideal phase shown by a broken line is exactly opposite to the corresponding extents of the first interpolation. The additional superposition of the two interpolations carried out in parallel thus brings about a compensation of the individual non-linearities (and thus an output phase P which lies approximately on the broken line).

Figure 7:
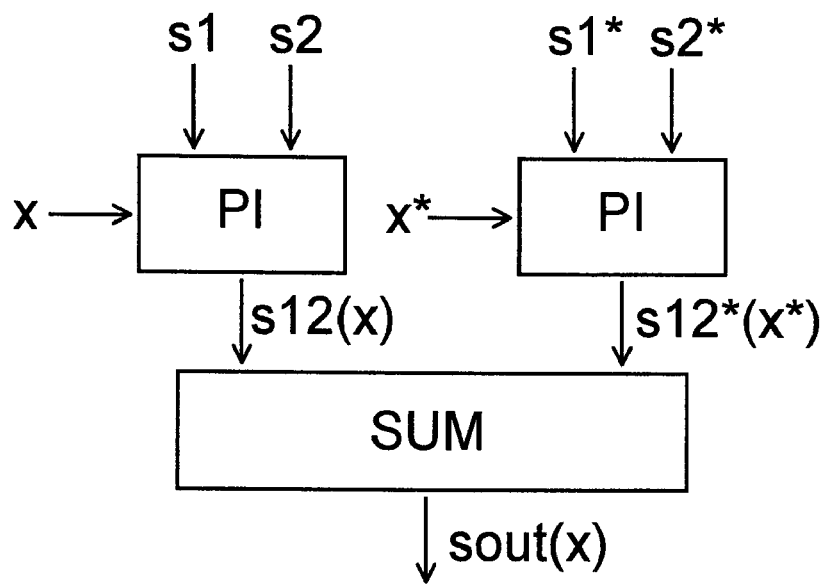
FIG. 7 shows a block diagram illustrating the mode of operation of the first embodiment.

A switching arrangement suitable for implementing this linearised method is shown in the block diagram of FIG. 7. In addition to the interpolation between input signals s1, s2 (controlled by a signal x), a further interpolation is carried out between two signals s1*, s2* (controlled by a signal x*). This results in interpolation signals s12(x) and s12*(x*), which are added in the following in order to obtain an output signal sout(x) in which the weighting-dependent falsifications of the individual interpolations are compensated for.

The control signal x* (weighting parameter) required for the further interpolation may be obtained from the control signal x in a simple manner. For the example illustrated in FIG. 5 and in case an output signal with a phase P is generated in the range from 0° to 120°, the following example values can, in summary, be provided for the phases of the input signals, the control signals x and x* and the output phase P to be used:

| Phase of s1: | Phase of s2: | Phase of s1*: | Phase of s2*: | x: | x*: | P: |
|---|---|---|---|---|---|---|
| 0° or 240° | 120° or 0° | 300° | 60° | 0 or 8 | 4 | 0° |
| 0° | 120° | 300° | 60° | 1 | 5 | 15° |
| 0° | 120° | 300° | 60° | 2 | 6 | 30° |
| 0° | 120° | 300° | 60° | 3 | 7 | 45° |
| 0° | 120° | 300° or 60° | 60° or 180°, resp. | 4 | 8 or 0, resp. | 60° |
| 0° | 120° | 60° | 180° | 5 | 1 | 75° |
| 0° | 120° | 60° | 180° | 6 | 2 | 90° |
| 0° | 120° | 60° | 180° | 7 | 3 | 105° |
| 0° or 120° | 120° or 240°, resp. | 60° | 180° | 8 or 0, resp. | 4 | 120° |

The values given in the table are, of course, to be understood as examples only. The number and phase position of the plurality of input signals in particular as well as the number of possible interpolation steps can be provided differently.

The described improved interpolation method may also be realised by using two phase interpolators of the type shown in FIG. 4, which are switched in parallel.

In a further development it is envisaged that the—with regard to the use of transductance stages—particularly problematic interpolation states "in the corners" of the polygons (triangles in FIG. 5) defined by the plurality of input signals are avoided. To this end it is envisaged, for example, that for the weighted superposition always from zero different weights be provided for the first and second input signals and the two further input signals. In addition or as an alternative, it may be possible, for the weighted superposition, independently of the inputted control signal, to provide a certain "minimum weight" for the two input signals and/or the two further input signals. In FIG. 5 for instance, this measure may correspond to a shifting of the interpolation dots drawn along the polygon lines, for example by half of their mutual distance. The falsifications, which are particularly large in the area of the polygon corners, would thus be avoided right from the beginning.

Figure 8:
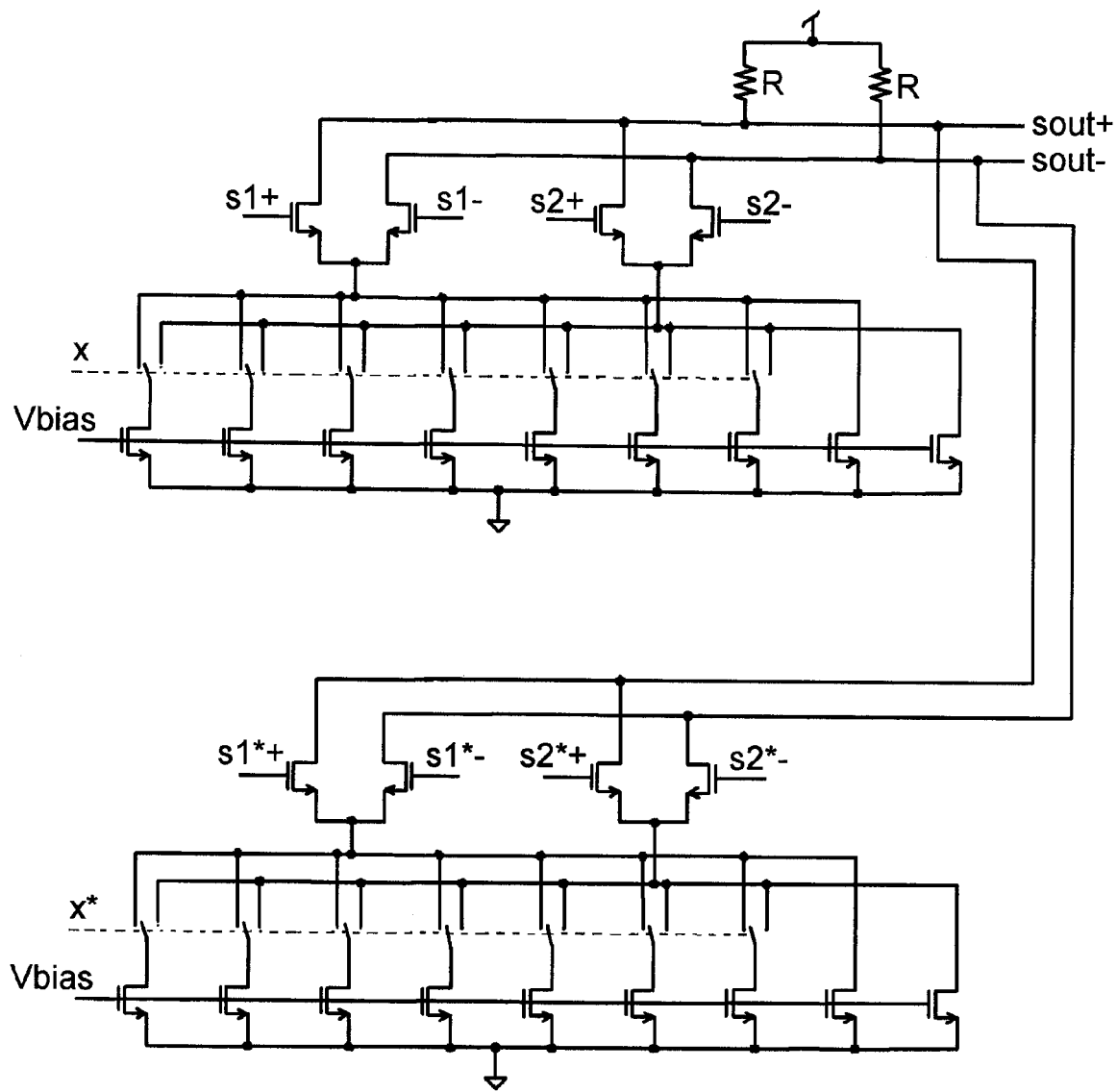
FIG. 8 is a circuit-technical realisation of a phase interpolator according to a second embodiment of the invention.

A circuit-technical realisation of this further development is illustrated in FIG. 8. The circuit arrangement, in essence, corresponds to a parallel arrangement of two phase interpolators of the type shown in FIG. 4. In contrast to mere parallel arrangement, however, an essential difference consists in the fact that each digital/analog converter of the two phase interpolators has two current sources (in FIG. 8 on the rightmost side in each case) which supply only one half of the current compared to the other current sources—in one case permanently to one of the two transductance stages and in the other permanently to the other of the two transductance stages. The switchover of the current supply caused by the control signal x and x* resp., only applies to the remaining current sources (only 7 in this case).

The invention claimed is:

1. A method for generating an electric output signal (sout) with a specified frequency and an output phase (P) dependent upon a control signal (x), comprising the steps generating, in response to the control signal (x), a first phase interpolation signal (s12) comprising a weighted superposition of a first input signal (s1) and a second input signal (s2), wherein the first and second input signals (s1, s2) have the specified frequency, but different input signal phases, generating, in response to the control signal (x), a second phase interpolation signal (s12*) comprising a weighted superposition of a third input signal (s1*) and a fourth input signal (s2*), wherein the first and second input signals (s1, s2) have the specified frequency, but different input signal phases, wherein the phase difference between the first input signal (s1) and the second input signal (s2) is substantially equal to the phase difference between the third input signal (s1*) and the fourth input signal (s2*), and wherein the third and fourth input signals (s1*, s2*) are phase-shifted by substantially one half of said phase difference between the first and second input signals (s1, s2), such that the phase of the first interpolation signal (s12) and the phase of the second interpolation signal (s12*) are substantially equal to the output phase (P), and generating the output signal (sout) as a superposition of the first and second interpolation signals (s12, s12*).

2. The method according to claim 1, wherein a plurality of input signals with fixedly specified input phases distributed equidistantly over the 360° range is provided and wherein the steps of generating the first and second phase interpolation signals includes selecting, responsive to the control signal (x), the input signals (s1, s2, s1*, s2*).

3. The method according to claim 1, wherein the phase difference is 120°.

4. The method according to claim 1, wherein the control signal (x) is a digital signal and the phase (P) of the output signal (sout) is generated accordingly in discrete phase stages.

5. The method according to claim 1, wherein for weighted superposition always from zero different weights of the first and second input signals (s1, s2) and always from zero different weights of the third and fourth input signals (s1*, s2*) are provided.

6. The method according to claim 1, wherein the step of generating the first phase interpolation signal includes adjusting a first parallel arrangement of adjustable transconductance stages by the control signal (x), to each of which one of the first and second input signals (s1, s2) is supplied for providing the first interpolation signal (s12), and wherein the step of generating the second phase interpolation signal includes adjusting a second parallel arrangement of adjustable transconductance stages dependent upon the control signal (x), to each of which one of the third and fourth input signals (s1*, s2*) is supplied for providing the second interpolation signal (s12*).

7. A circuit arrangement for generating an electric output signal (sout) with a specified frequency and an output phase (P) dependent upon a control signal (x), comprising a first phase interpolator means for generating, in response to a control signal (x), a first phase interpolation signal (s12) from the weighted superposition of a first input signal (s1) and a second input signal (s2), wherein the first and second input signals (s1, s2) have the specified frequency, but different input signal phases, a second phase interpolator means for generating, in response to the control signal (x), a second phase interpolation signal (s12*) from the weighted superposition of a third input signal (s1*) and a fourth input signal (s2*), wherein the third and fourth input signals (s1*, s2*) have the specified frequency, but different input signal phases, wherein the phase difference between the first input signal (s1) and the second input signal (s2) is substantially equal to the phase difference between the third input signal (s1*) and the fourth input signal (s2*), and wherein the third and fourth input signals (s1*, s2*) are phase-shifted by substantially one half of said phase difference between the first and second input signals (s1, s2), such that the phase of the first interpolation signal (s12) and the phase of the second interpolation signal (s12*) are substantially equal to the output phase (P), and an adder, by means of which the first and second interpolation signals (s12, s12*) are superposed for the generation of the output signal (sout).

8. The circuit arrangement of claim 7, wherein the first phase interpolation means comprises a first parallel arrangement of adjustable transconductance stages, each responsive to the control signal (x), and to each of which one of the first and second input signals (s1, s2) is supplied for providing the first interpolation signal (s12) having substantially the output phase (P), and wherein the second phase interpolation means comprises a second parallel arrangement of adjustable transconductance stages, which are each adjusted by the control signal (x) and to each of which one of the third and fourth input signals (s1*, s2*) is supplied for providing the second interpolation signal (s12*) having substantially the output phase (P).

* * * * *